(12) United States Patent
Smith et al.

(10) Patent No.: US 6,460,164 B1
(45) Date of Patent: Oct. 1, 2002

(54) INTEGRATION OF EXTERNALLY DEVELOPED LOGIC IN A MEMORY MAPPED SYSTEM

(75) Inventors: Mike A. P. Smith, Tavistock; Philip I. J. Ainsley, Modbury; Maison L. Worroll, Oreston, all of (GB)

(73) Assignee: Mitel Semiconductor Limited, Wiltshire (GB)

( * ) Notice: Subject to any disclaimer, the term of this patent is extended or adjusted under 35 U.S.C. 154(b) by 0 days.

(21) Appl. No.: 09/456,732

(22) Filed: Dec. 8, 1999

(30) Foreign Application Priority Data

Dec. 11, 1998 (GB) ................................................ 9827183

(51) Int. Cl.⁷ .............................................. G06F 17/50
(52) U.S. Cl. ..................................... 716/1; 716/4; 716/8
(58) Field of Search ............................... 716/2, 1, 4, 17, 716/18, 8, 12; 711/202, 147

(56) References Cited

U.S. PATENT DOCUMENTS

| 4,303,990 A | 12/1981 | Seipp |
| 5,379,382 A | 1/1995 | Work et al. |
| 5,452,227 A | 9/1995 | Kelsey et al. |
| 5,592,625 A | * 1/1997 | Sandberg .................... 711/147 |
| 5,687,325 A | 11/1997 | Chang |
| 5,860,141 A | * 1/1999 | Washington et al. ......... 711/202 |
| 5,898,595 A | * 4/1999 | Bair et al. ...................... 716/2 |

FOREIGN PATENT DOCUMENTS

| EP | 0 871 223 A1 | 10/1998 |
| JP | 7129428 | 5/1995 |
| JP | 7129428 | 5/1996 |
| WO | WO 97/40450 | 10/1997 |
| WO | WO 98/15976 | 4/1998 |

* cited by examiner

Primary Examiner—Matthew Smith
Assistant Examiner—Leigh Marie Garbowski
(74) Attorney, Agent, or Firm—Kirschstein, et al.

(57) ABSTRACT

An integrated circuit comprises an application-non-specific library cell, externally developed logic circuitry integrated with the library cell, and an up-integration module (UIM) connected to the library cell and to the logic circuitry and providing a two-way interface between the library cell and the logic circuitry and between the library cell and an external device. The logic developed for a prototype system comprising such a library cell in association with external logic circuitry can be integrated into the circuit without requiring any change in its function or in the program code developed for the prototype system.

16 Claims, 2 Drawing Sheets

INTEGRATION OF EXTERNALLY DEVELOPED LOGIC IN A MEMORY MAPPED SYSTEM

FIELD OF THE INVENTION

This invention relates to the integration of externally developed logic in a memory mapped system and is concerned more specifically, but not exclusively with such integration in application-specific integrated circuits (ASICs),

BACKGROUND TO THE INVENTION

The development of deep submicron integrating technology has made possible the integration of complete systems within a single semiconductor device. The strong point for the design of such systems is usually a set of established functions which may already be implemented as separate devices. When developing such systems, designers typically create a prototype system by interconnection of two or more separate devices, and then develop system software on the basis of the prototype system to test the system interaction. Some customers also use these prototype systems for early production runs, so that they can test the market response to the product and gauge its future potential. Once a viable product has been proved, the system is then rationalised to reduce its cost. This involves combination of the separate devices into a single chip, and such rationalisation can give rise to difficulties in the transition from the separate devices to the single chip solution due to the fact that integration of the logic necessitates changes to the software and hardware. Such changes lead to differences in the operation of the prototype system and the single chip solution, and provide an increased marketing risk Also re-verification of the solution takes time and increases the time-to-market (TTM) period, thus reducing the marketable lifespan of the product.

An example will now be given of the manner in which an ASIC might be developed using current technology. This example will be described with reference to FIG. 1 and is concerned with development of a system comprising a processor based microcontroller 1 in association with memory devices 2 and 3 and other user-specific peripheral components 4 and 5. Peripheral components may be one of a bus master or a bus slave. A prototype system is produced in which the components are provided on separate interconnected devices which share common address and data busses, collectively called the system bus 6, for communication between them. Typically six to twelve months is then spent in developing the hardware and software before the prototype system is finally shown to work correctly in its required application. Commonly limited quantities of the prototype system are then released for integration by third parties and to assess the general market response. If the market response is favourable filer development is required by integrating the memory and peripheral components with the microcontroller to create an ASIC and to thereby provide a cost reduction. The final integrated circuit solution may comprise one or more interconnected chips.

However the current approach to such integration is to consider the ASIC solution as a totally new device, and thus reworking of all interfaces and changing of data paths is required in order to obtain the perceived optimum solution. Such an approach invariably leads to significant changes to the software and has a knock-on effect on system validation test suites. The solution takes a significant period of time and also increases the risk of errors as the previously developed prototype system has to be significantly altered.

SUMMARY OF THE INVENTION

It is an object of the invention to provide a means by which the integrated circuit solution can be developed from a prototype system with minimum change to the integrating logic or to any associated software.

According to the present invention there is provided an integrated circuit comprising an application-non-specific library cell, externally developed logic circuitry integrated with the library cell, and an up-integration module (UIM) connected to the library cell and to the logic circuitry and providing a two-way interface between the library cell and the logic circuitry and between the library cell and an external device such that logic developed for a prototype system comprising such a library cell in association with external logic circuitry can be integrated into the circuit without requiring any change in its function or in the program code developed for the prototype system.

The use of an application-non-specific library cell in association with the externally developed logic and the UIM enables the transition from the prototype system to the ASIC to be effected in a straightforward manner without requiring significant changes to the logic and/or associated software.

The invention also provides a method of integrating externally developed logic in a memory mapped system, the method comprising creating a prototype system using an application-non-specific library cell in association with external logic circuitry, and subsequently creating an integrated circuit by combining such a library cell with the logic circuitry and an up-integration module (UIM) which is connected to the library cell and to the logic circuitry and provides a two-way interface between the library cell and the logic circuitry and between the library cell and an external device such that the externally developed logic is integrated into the circuit without requiring any change in its function or in program code developed for the prototype system.

DETAILED DESCRIPTION OF A PREFERRED EMBODIMENT

For convenience we set out below appropriate explanations of a number of terms used in the description of this specification. It is to be understood that these explanations are given merely to aid better understanding of the description, and that they are not to be considered as limiting the scope of the invention claimed.

Definitions

ARM—Advanced Risc Machine, a company based in Cambridge responsible for the design of processor cores.

Risc—Reduced Instruction Set Computer—A machine which keeps it's instructions short and simple, to allow faster operation.

Processor—A block which is programmable to perform various tasks at run time. The processor has no intelligence, and simply contains a counter which increments addresses to fetch instructions, starting at address '0'. The instructions are used to perform operations on data, or to change the instruction sequence, by forcing changes to the address counter. A processor sees the outside world as memory, which it can access by reading from, or writing to, an address. It asserts this address on it's address port, and expects data to appear from that address on it's data port.

Address bus—The processor, or other device in control of the system, forces an address (a binary number) on to the address bus, which consists of multiple wires, one for each binary bit.

Data bus—An array of wires, separate from the address bus, which carries data or instructions to or from the device controlling the system, usually the processor.

System bus—Collective name for the address bus, data bus, and associated control signals.

Microcontroller—A processor with additional devices which make it suitable for use in a system. This will usually be provided for a specific application, for example a telephone or fridge, rather than a general purpose machine like a PC.

Memory—A device which can hold instructions or data in a large array of storage locations, which are accessible by presenting an address to the device, together with control inputs, which requests a read or a write.

Peripheral device—any device, including memory, which performs a specific task, and communicates with the processor, using the address and data busses. Peripheral devices can act either as slaves to the processor or can communicate as system masters, initiating transfers by themselves.

Memory mapped—Most systems which have an address and data bus type architecture and are made up of several components use the technique of memory mapping as a means of being able to uniquely address each component. This is typically done by decoding higher order bits of the address bus to subdivide the total addressable range and hence create a memory map. Each device is then typically allotted its own area of the memory map.

Figure 2:
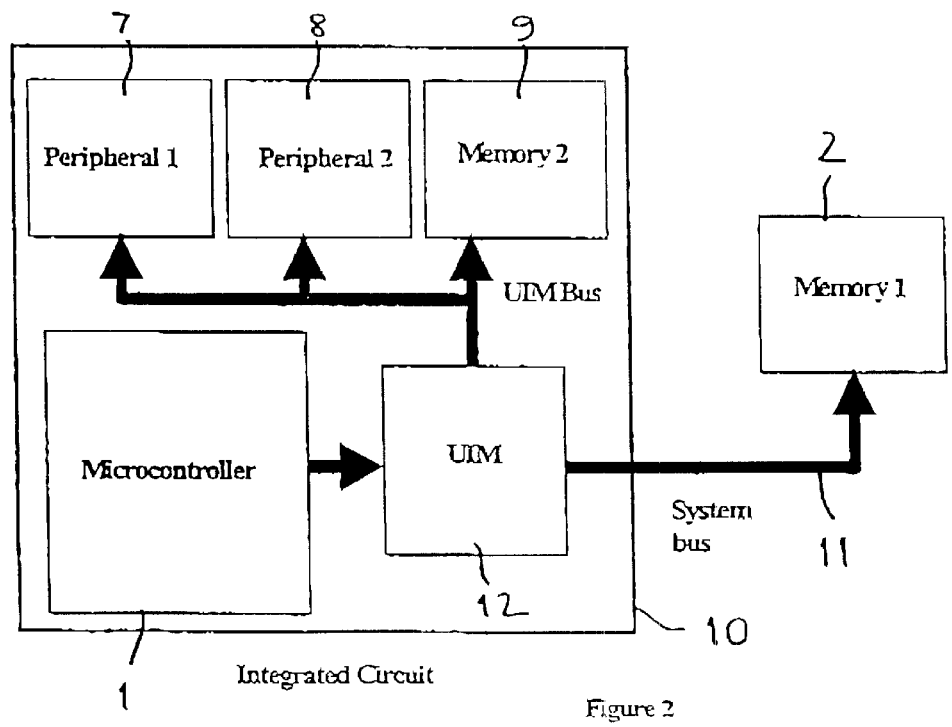
FIG. 2 is a block diagram of an embodiment of the invention after integration connected to external memory.

An embodiment of the invention will now be described with reference to FIG. 2. This makes use of a standard microcontroller as a library cell to create an embedded microcontroller which is used by the customer to create a prototype system. However it should be appreciated that the invention is of broad application, and that the library cell which forms the core of the system need not be a microcontroller.

Figure 1:
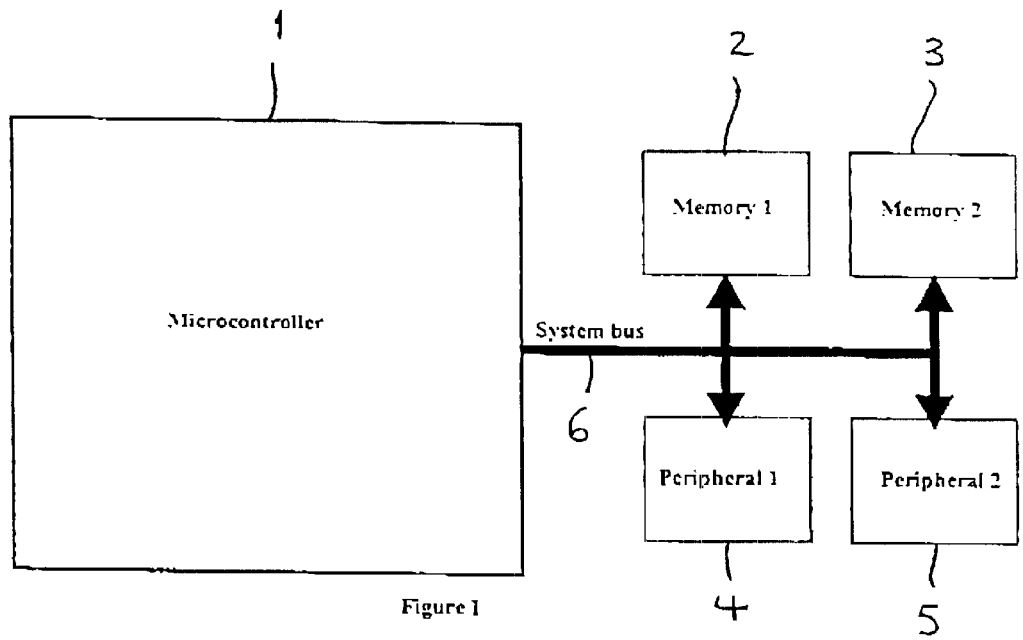
FIG. 1 is a block diagram showing the manner in which an ASIC might be developed using current technology.

FIG. 1 shows a typical development system, using the microcontroller, which has been developed using an ARM processor, together with other library cells. The embodiment uses the system bus which consists of address bus, data bus and control signals to communicate with external memory or peripheral devices. The devices are said to be memory mapped, since each contains storage locations, which are represented by specific numbers in the possible range of numbers available from the address bus. The function and timing of the system bus is usually dictated by the requirements of any standard memory devices on the bus. Other custom designed peripherals are therefore designed to match this communication standard, 'protocols'.

Once the system function has been proved, the system cost can be reduced by integrating the peripheral devices with the microcontroller in a single integrated circuit package. FIG. 2 shows the system after integration of three of the original external devices with the microcontroller 1 in an integrated circuit 10. This is achieved in accordance with the invention by the use of an up-integration module (UIM) 12 which allows such integration with no significant change in logic. This is because the UIM 12 provides an interface on the integrated circuit 10 which is functionally equivalent to that which the peripheral devices have been using during system development. An advantage of this approach is that any software code which has been developed for the system is useable after integration, as the memory map of the peripherals as seen by the microcontroller 1 has not changed. Also, once prototypes of the new integrated device have been made, the device function can be confirmed by placing it in the original development system, and using the UIM 12 to switch between the external devices, such as 3, 4 and 5, and their integrated equivalents 7, 8 and 9.

It should be understood that the development route may use a physical microcontroller and peripherals as described above, or the system may be developed using simulation.

In the particular example to be described a version of the microcontroller, which has been provided with an I/O ring and bonded within a package to create a finished device, is used by the customer to create the prototype system involving the design and verification of the necessary logic and software coding. When integration of the solution into an application-specific integrated circuit (ASIC) is required, a similar microcontroller is integrated within the circuit 10 together with the UIM 12 and the customer's application-specific logic (ASL).

The UIM 12 connects to the address and data busses of the microcontroller 1 and duplicates them to create two sets of address and data busses which are functionally identical UIM internal and UIM external ports). The UIM internal and external ports are in identical areas of the memory map but are selectable. This means that devices that have been designed (in terms of either their hardware or software content) to operate in a certain memory area which is located externally of the integrated circuit 10 (on the UIM external port) can be connected to the UIM internal port without any significant modifications (of either their hardware or software content). Thus the UIM 12 allows the choice of which UIM port the microcontroller 1 is to transfer data to and from. This means that it effectively mirrors specific areas of a system memory map and allows a choice to be made as to the source and destination of data transfers. The UIM external port is connected to devices, such as the external memory 2, which are external to the integrated circuit 10 by means of input/output cells so as to allow the microcontroller 1 to transfer information to and from such external devices, The UIM internal port is connected to devices, such as the peripheral devices 7 and 8 and the memory 9, which are internal to the integrated circuit 10 so as to allow the microcontroller 1 to transfer information to and from such internal devices.

The UIM 12 allows the transfer of data between the two UIM ports either under control of the controller 1 or under the control of one of the devices connected to either of the UIM ports. The UIM 12 also provides a route for test data to be applied from the UIM external port directly to and from the UIM internal port. In an alternative implementation, it would be possible to exclude the address or data bus from the UIM.

It will be appreciated that the key point of the new arrangement is that it allows integration of the prototype solution without significant change to the developed logic by virtue of the fact that the logic is integrated externally from the point of view of the microcontroller 1. The components 7, 8 and 9 are integrated only after they have been satisfactorily designed and verified during the prototype stage, and the logic netlist is typically simply connected to the UIM data ports so that the netlist for the completed circuit can be produced. The UIM ports may be designed to mimic the behaviour of the microcontroller's memory and peripheral controller (MPC) external I/Os, the only difference being the bidirectional data bus which is split into uim_mdata_in and uim_mdata_out. As bidirectional functionality is usually obtained within an I/O cell, and such a cell is removed when up-integration occurs, it is unlikely that any logic changes are required. Similarly the data paths will still involve the MPC after integration so that no software code changes should be required.

It will be appreciated that the UIM 12 becomes a major interchange block in the final device. However this level of complexity is invisible to the user and is justified by simplicity in application. During testing the designer commonly requires the ability to switch the device between external and internal memory areas with no change in code so that the device can be verified with original external hardware. Thus the UIM 12 has the ability to switch data and address buses between internal and external logic, depending on whether internal or external memory is selected. Furthermore the UIM 12 provides the internal devices with the ability to access the external memory 2, either under the control of the direct memory access (DMA) module of the microcontroller 1 or directly as a master of the system bus. The internal devices are also provided with access to slaves inside the microcontroller 1, as well as making visible transactions on the internal bus of the microcontroller 1 and between the microcontroller 1 and the internal devices for debugging purposes.

Due to the nature of the UIM 12 any software which has been written for the prototype system can be directly used in the final device. Any changes in data flows through the UIM 12 following up-integration are effectively transparent to the user and, by virtue of the fact that no changes have to be made to the software, initial evaluation of the final device can be commenced with as few unknowns as possible.

If additional customer logic already exists, for example, when an existing multichip solution is to be integrated onto a single application-specific integrated circuit, the prototype system can be produced extremely quickly, and this allows system level evaluation to commence and any performance limitations to be identified as soon as possible. If the designer wishes to verify the logic entirely within a computer aided engineering (CAE) simulation environment, then the appropriate connections can be made directly to the embedded microcontroller model in which case the initial prototyping stage is not required.

The interface point for up-integration is a port on the UIM 12 which mimics the normal memory interface and is controllable from the existing memory controller in the same way as any other memory area. The designer is able to connect directly to the port and to fully stimulate the system. When the development phase is completed and the design has been verified by simulation, the layout and fabrication of the complete integrated circuit can be effected by a series of steps which need not take significantly longer than for a standard gate array.

As a useful byproduct of the technique of the invention software developers are provided with a tool for development of prototype systems, as well as the possibility of using the same systems for early production.

Figure 3:
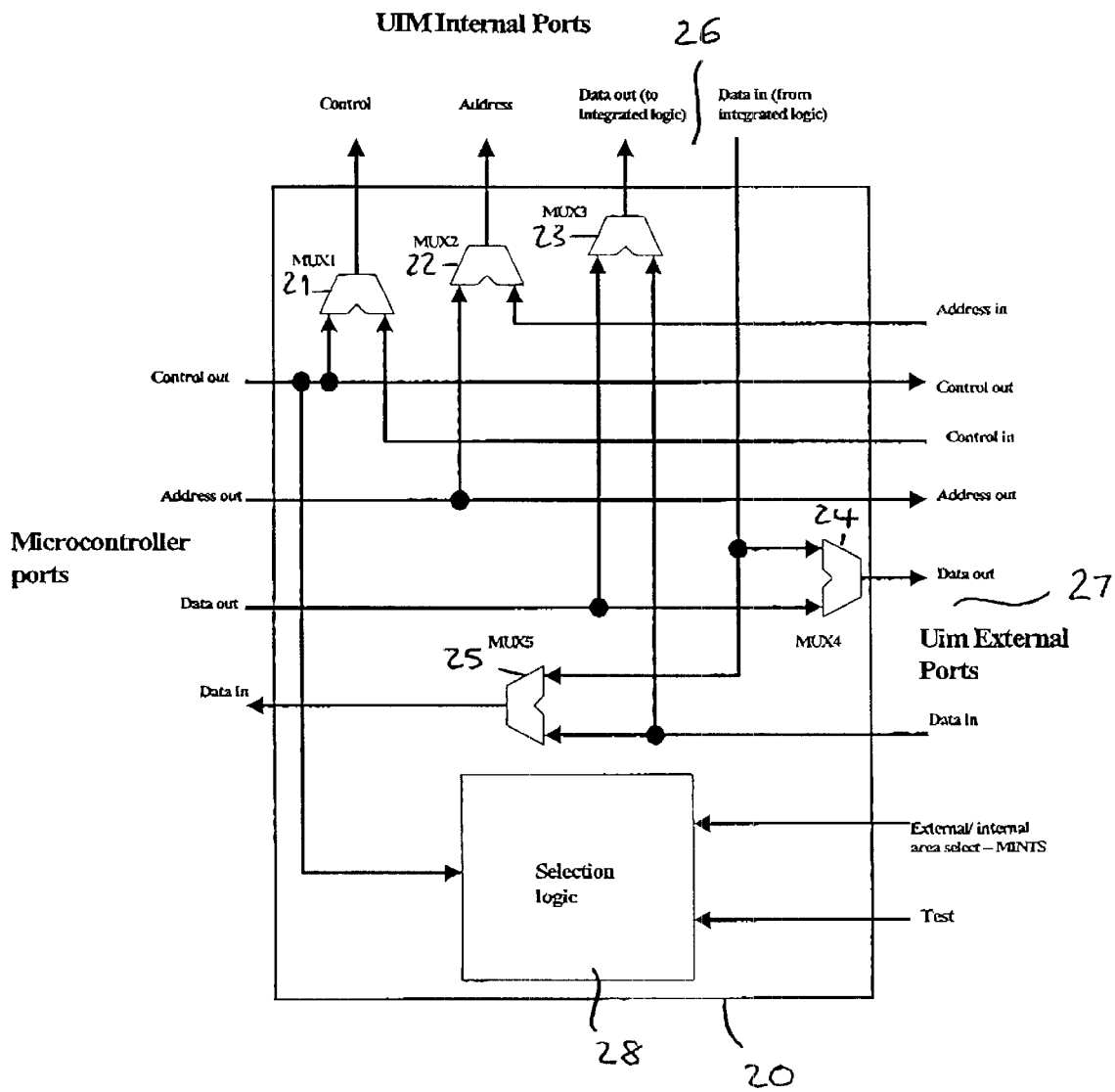
FIG. 3 is a block diagram of a preferred implementation of the UIM.

In a possible variant, some of the integrated logic circuitry is provided with independent access to the internal bus of the controller 1 instead of being connected to the internal port of the UIM 12, whereas the remainder of the logic circuitry is corrected to the internal port of the UIM, A preferred implementation of the UIM will now be described with reference to FIG. 3. In this case the UIM 20 contains various two-way multiplexers 21, 22, 23, 24 and 25 which are switches which are controllable to allow either one of their inputs through to their outputs and which function to direct the flow of data, control and address signals to the internal ports 26 or external ports 27 of the UIM 20, in dependence on the location of the logic or memory functions which have been integrated. The multiplexers 21, 22, 23, 24 and 25 are controlled by the selection logic circuitry 28 which monitors the memory area selected and external control signals (MINTS) pins which indicate whether memory areas are internal to the integrated circuit. The MINTS pins may be hard wired in the final application, or may be changed during operation to increase flexibility. The selection logic circuitry 28 also has a TEST input enabling the multiplexers 21, 22, 23, 24 and 25 to be set to allow direct access to the internal ports 26 of the UIM 20, For clarity the connections between the selection logic circuitry 28 and the various multiplexers have been omitted from the figure, and for the same reason the signal lines arc shown as single lines whereas in practice these are busses.

The selection logic circuitry 28 switches the various multiplexers according to the control signals received. In the normal mode, such switching is dependent on the memory area selected and the MINTS control pins which dictate whether this area is internal or external. The selection logic circuitry 28 also detects whether the device is to be placed into its test mode and controls the multiplexers accordingly. The output of the multiplexer 21 is the internal control port of the UIM 20. If the memory area selected is internal (according to MINTS control pins) the multiplexer 21 is switched to select the microcontroller control out signals Alternatively, if the TEST input is active, then the external control in port of the UIM 20 is selected. Furthermore the output of the multiplexer 22 is the internal address port of the UIM 20. If the device is in the normal run mode, the microcontroller address out signals are directed to both the external and internal address ports of the UIM 20. Alternatively, if the device is in test mode, then an address applied to the external address port is routed to the internal address port of the UIM 20.

Furthermore the output of multiplexer 23 is the internal data out port of the UIM 20. If the transfer requested is a write to a memory area connected to the internal port of the UIM 20 (as determined by the MINTS pins) the microcontroller data out signals are directed to the internal data out port of the UIM 20. Alternatively, if the device is in test mode, then data is routed from the external data in port to the internal data out port to allow testing of internal logic. This route will also be activated if logic on the internal bus or the external bus has requested a transfer of data from the external bus to the interval bus. The output of the multiplexer 24 is the external data out port of the UIM 20. If the transfer requested is a write to a memory area connected to the external port of the UIM 20 (as determined by the MINTS pins) the microcontroller data out port is selected. Alternatively, if the device is in test mode, then data is routed from the internal data in port to the external data out port to allow testing of the internal logic. This route will also be activated if logic on the internal bus or the external bus has requested a transfer of data from the internal bus to the external bus. Finally the multiplexer 25 directs data from either the internal data in port or the external data in port to the microcontroller data in port depending on the memory area selected by the microcontroller and the location of that area, as determined by the MINTS pins.

What is claimed is:

1. An integrated circuit comprising:

a) an application-non-specific library cell;

b) externally developed logic circuitry integrated with the library cell; and c) an up-integration module (UIM) connected to the library cell and to the logic circuitry and providing a two-way interface between the library cell and the logic circuitry and between the library cell and an external device, such that logic developed for a prototype system comprising such a library cell in association with external logic circuitry can be integrated into the circuit without requiring any change in its function or in the program code developed for the prototype system, said UIM providing duplicate address and data busses which are functionally equivalent for linking the library cell to the logic circuitry and the external device.

2. The integrated circuit according to claim 1, wherein the UIM provides test access to the library cell and the integrated logic circuitry.

3. The integrated circuit according to claim 1, wherein the UIM provides a communication path between the integrated logic circuitry and the external device.

4. The integrated circuit according to claim 1, wherein the library cell is an embedded microcontroller.

5. The integrated circuit according to claim 4, wherein the microcontroller incorporates a direct memory access (DMA) module controlling communication between the integrated logic circuitry and the external device.

6. The integrated circuit according to claim 1, wherein the integrated logic circuitry is a memory device.

7. The integrated circuit according to claims 1, wherein said externally developed logic circuitry has an address location within a system memory map.

8. The integrated circuit according to claim 1, wherein said externally developed logic circuitry is capable of addressing components having an address location within a system memory map.

9. An integrated circuit comprising:

a) an application-non-specific library cell;

b) externally developed logic circuitry integrated with the library cell; and c) an up-integration module (UIM) connected to the library cell and to the logic circuitry and providing a two-way interface between the library cell and the logic circuitry and between the library cell and an external device, such that logic developed for a prototype system comprising such a library cell in association with external logic circuitry can be integrated into the circuit without requiring any change in its function or in the program code developed for the prototype system, said UIM providing test access to the library cell and the integrated logic circuitry.

10. The integrated circuit according to claim 9, wherein the UIM provides duplicate address and data busses which are functionally equivalent for linking the library cell to the logic circuitry and the external device.

11. The integrated circuit according to claim 9, wherein the UIM provides a communication path between the integrated logic circuitry and the external device.

12. The integrated circuit according to claim 9, wherein the library cell is an embedded microcontroller.

13. The integrated circuit according to claim 12, wherein the microcontroller incorporates a direct memory access (DMA) module controlling communication between the integrated logic circuitry and the external device.

14. The integrated circuit according to claim 9, wherein the integrated logic circuitry is a memory device.

15. The integrated circuit according to claim 9, wherein said externally developed logic circuitry has an address location within a system memory map.

16. The integrated circuit according to claim 9, wherein said externally developed logic circuitry is capable of addressing components having an address location within a system memory map.

* * * * *